(12) United States Patent
Lee et al.

(10) Patent No.: US 7,141,123 B2
(45) Date of Patent: Nov. 28, 2006

(54) METHOD OF AND APPARATUS FOR REMOVING CONTAMINANTS FROM SURFACE OF A SUBSTRATE

(75) Inventors: Moon-hee Lee, Suwon (KR); Kun-tack Lee, Suwon (KR); Woo-gwan Shim, Seoul (KR); Jong-ho Chung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 111 days.

(21) Appl. No.: 10/759,093

(22) Filed: Jan. 20, 2004

(65) Prior Publication Data

US 2004/0144401 A1    Jul. 29, 2004

Related U.S. Application Data

(62) Division of application No. 10/012,564, filed on Dec. 12, 2001, now Pat. No. 6,701,942.

(30) Foreign Application Priority Data

Mar. 28, 2001    (KR) ............................... 2001-16327

(51) Int. Cl.
  *B08B 7/00*     (2006.01)
  *B08B 3/12*     (2006.01)
  *B08B 6/00*     (2006.01)
  *B08B 3/00*     (2006.01)
  *B08B 5/00*     (2006.01)
  *B08B 1/02*     (2006.01)
  *B08B 7/04*     (2006.01)

(52) U.S. Cl. ............................... 134/7; 134/1; 134/1.3; 134/6; 134/9; 134/26; 134/30; 134/31; 134/32; 134/34; 134/37; 34/266; 34/275

(58) Field of Classification Search ............... 134/1, 134/1.3, 2, 7, 9, 26, 30, 31, 32, 34, 37, 6; 438/906; 34/266, 275
See application file for complete search history.

(56) References Cited

U.S. PATENT DOCUMENTS

| | | | |
|---|---|---|---|
| 4,909,914 A | | 3/1990 | Chiba et al. |
| 5,081,068 A | * | 1/1992 | Endo et al. ............... 134/2 |
| 5,125,979 A | | 6/1992 | Swain et al. |
| 5,209,028 A | | 5/1993 | McDermott et al. |
| 5,315,793 A | | 5/1994 | Peterson et al. |
| 5,372,652 A | * | 12/1994 | Srikrishnan et al. ........ 134/7 |

(Continued)

FOREIGN PATENT DOCUMENTS

JP    3-159237    *    7/1991

(Continued)

*Primary Examiner*—M. Kornakov
(74) *Attorney, Agent, or Firm*—Volentine Francos & Whitt

(57) ABSTRACT

A cleanling apparatus for removing contaminants from the surface of a substrate includes two parts: one which produces an aerosol including frozen particles and directs the aerosol onto the surface of the substrate to remove contaminants from the surface by physical force, and another part in which a fluid including a gaseous reactant is directed onto the surface of the substrate while the surface is irradiated to cause a chemical reaction between the reactant and organic contaminants on the surface, to chemically removing the organic contaminants. In the method of cleaning the substrate, the physical and chemical cleaning processes are carried out in a separate manner from one another so that the frozen particles of the aerosol are not exposed to the effects of the light used in irradiating the surface of the substrate. Therefore, the effectiveness of the aerosol in cleaning the substrate is maximized.

4 Claims, 4 Drawing Sheets

U.S. PATENT DOCUMENTS

| | | |
|---|---|---|
| 5,613,509 A | 3/1997 | Kolb et al. |
| 5,699,679 A * | 12/1997 | Wu et al. ................ 62/617 |
| 5,759,892 A * | 6/1998 | Wang et al. ............. 438/254 |
| 5,967,156 A | 10/1999 | Rose et al. |
| 6,066,032 A * | 5/2000 | Borden et al. ............ 451/80 |

FOREIGN PATENT DOCUMENTS

| | | |
|---|---|---|
| JP | 2000315672 | 11/2000 |

* cited by examiner

FIG. 3

AEROSOL

FROZEN Ar

611

610

615

METHOD OF AND APPARATUS FOR REMOVING CONTAMINANTS FROM SURFACE OF A SUBSTRATE

This is a divisional of U.S. patent application Ser. No. 10/012,564, filed Dec. 12, 2001, now U.S. Pat. No. 6,701,942, the entire contents of each which are hereby incorporated herein by reference for all purposes as if fully set forth herein.

BACKGROUND OF THE INVENTION

1. Field of the Invention

The present invention relates to a method of and apparatus for removing contaminants, such as particles and organic material, from a semiconductor substrate or a liquid crystal display (LCD) substrate.

2. Description of the Related Art

In the process of manufacturing an integrated circuit (IC), such as a memory device or an LCD, the surface of a substrate of the IC may be contaminated. Contaminants on the surface of a substrate may include organic material, dust, residue, and metal contaminants. Such contaminants may be divided into two types: organic materials that can be removed mainly by a chemical reaction and particles that can be removed mainly by physical force. This contamination typically occurs when the substrate is being stored or is in a stand-by state between successive processes. The contaminants may create defects that ultimately cause the integrated circuits to malfunction. For example, organic residue on the surface of a substrate may cause a defect in a subsequently formed thin film or may increase the contact resistance of the device.

Thus, a step of cleaning the surface of a substrate, such as a wafer, is attendant to each process performed in the manufacturing of an integrated circuit such as memory device or an LCD. The cleaning is performed to remove organic contaminants or contaminant particles from the surface of the substrate. Conventional wet cleaning techniques have been used for cleaning the surface of a substrate. It is well-known that these wet cleaning techniques are very effective in removing contaminant particles from the surface of a substrate. Furthermore, the wet cleaning techniques include the use of a spin brush during cleaning or an ultrasonic or megasonic cleaner to enhance the cleaning effect.

Despite the significant efforts directed towards cleaning the surface of a substrate, the effectiveness of conventional wet cleaning techniques is quite limited when the circuit patterns of the memory device or LCD are extremely fine. For example, the use of a spin brush or an ultrasonic cleaner may damage the fine patterns of a memory device or an LCD. Furthermore, although a spin brush or an ultrasonic cleaner in a wet cleaning process may be effective in removing large contaminant particles, they are hardly effective in removing particles on the order of submicrons.

Furthermore, along with the miniaturization of the patterns, there is a trend in which a gate or a bit line includes metal such as tungsten (W). Many conventional wet cleaning processes would be detrimental to the metal. Therefore, wet cleaning a substrate on which such a gate or bit line has been formed is limited to rinsing the substrate with deionized water or a minimal cleaning using a stripper. In these cases, it becomes increasingly difficult with any reliable degree to effectively prevent a defect from occurring during a fabrication process.

Recently, a number of new cleaning techniques have been developed for removing contaminants such as particles or organic residue. For example, according to one approach, an aerosol including microscopic frozen particles is sprayed over the surface of a substrate to remove contaminants from the surface of the substrate. U.S. Pat. No. 5,967,156 issued on Oct. 19, 1999 to Peter H. Rose et al., and entitled "Processing A Surface," describes a such a method.

More specifically, the patent discloses a method of removing foreign material (for example, particulate contaminants such as dust and metals, and organic material such as photoresist and fingerprints, and residue) from the surface of a substrate by reacting a reactant gas with the foreign material. An aerosol including frozen particles is applied along with a flow of the reactant to the surface of the substrate to aid the reaction of the reactant gas with the foreign material. The surface of the substrate is irradiated with infrared (IR) or ultraviolet (UV) light to heat the substrate, and thereby further aid the reaction of the reactant gas with the foreign material.

However, the effectiveness of the aerosol in cleaning the surface of the substrate is reduced because both the physical and chemical cleaning processes are performed simultaneously in the same place. More specifically, the ultraviolet or infrared light produced during the chemical cleaning process may reduce the effectiveness of the aerosol because ultraviolet and infrared light are radiant forms of energy. Therefore, the ultraviolet or infrared light is absorbed by the walls of the processing chamber and at the surface of the substrate, in particular, by contaminants on the substrate surface or by the reactant fluid. Furthermore, the ultraviolet or infrared light may also be absorbed by the nozzle from which the aerosol issues. Therefore, the temperature inside the processing chamber may rise so much as to preclude frozen particles from issuing from the nozzle. Even if the frozen particles do issue from the nozzle, there is high possibility that the frozen particles will evaporate before reaching the surface of the substrate. Thus, there are hardly any frozen particles to collide with contaminant particles.

Accordingly, it is highly desirable to provide a method of and apparatus for effectively removing contaminants, such as organic residues or particles, from the surface of a substrate.

SUMMARY OF THE INVENTION

An object of the present invention is to solve the above-described problems by providing a method of and apparatus for effectively removing contaminants, including particles and organic material, from the surface of a substrate in the process of fabricating an integrated circuit such as a memory or a liquid crystal display (LCD).

Cleaning apparatuses of the present invention include means by which particles on the surface of a substrate are removed mainly by physical force using an aerosol comprising frozen particles, and means by which organic contaminants are chemically removed in a separate process by a gaseous reactant and radiation providing activation energy for a chemical reaction between the reactant and organic contaminants on the surface of the substrate. That is, in the present invention, a physical cleaning process using frozen particles is performed independently of a chemical cleaning process using a fluid reactant and light so that the activation energy required by the chemical cleaning process does not reduce the effectiveness of the frozen particles used to carry out the physical cleaning process.

According to one aspect of the present invention, the cleaning apparatus includes: a transfer chamber, a first cleaning chamber connected to the transfer chamber, a reactant supplier associated with the first cleaning chamber so as to expose the surface of a substrate to a reactant within the first cleaning chamber, a light source also associated with the first cleaning chamber to irradiate the substrate and thereby supply the activation energy required to cause a chemical reaction between the reactant and contaminants on the surface of the substrate, a second cleaning chamber connected to the transfer chamber, and an aerosol generator associated with the second cleaning chamber for jetting an aerosol containing frozen particles onto the surface of the substrate within the second cleaning chamber.

The light source may be an ultraviolet or infrared lamp that irradiates the substrate within the first cleaning chamber.

In a specific method according to the present invention executed in conjunction with this apparatus, a substrate is transferred from the transfer chamber to one of the cleaning chambers whereupon one of the cleaning processes is performed therein, then the substrate is transferred to the other cleaning chamber via the transfer chamber whereupon the other cleaning process is performed. Accordingly, the infrared or UV light provided by the light source does not affect the efficacy of the frozen gas particles because the light and the frozen gas particles are provided in separate spaces, i.e., the first and second cleaning chambers.

The aerosol generator may be a nozzle disposed above the inlet of the second cleaning chamber for jetting the aerosol onto the surface of the substrate as the substrate enters the second cleaning chamber.

According to another aspect of the present invention, the cleaning apparatus includes: a transfer chamber, a cleaning chamber connected to the transfer chamber, an aerosol-generating nozzle disposed in the cleaning chamber for jetting an aerosol containing frozen particles onto the surface of a substrate transferred into the cleaning chamber, a reactant supplier that exposes the surface of the substrate to a reactant within the cleaning chamber for chemically removing contaminants from the surface of the substrate, and a laser beam generator that directs a laser beam onto the surface of the substrate transferred into the cleaning chamber in order to supply the activation energy required to chemically react the reactant with the contaminants.

The aerosol-generating nozzle and the laser beam generator are oriented so that the aerosol is directed onto a region of the substrate separate from that onto which the laser beam is directed while the substrate is being transferred through (to or from) the cleaning chamber. Accordingly, the laser beam used for chemically cleaning the substrate does not impinge the frozen particles used for physically cleaning the substrate.

In a specific method according to the present invention executed in conjunction with this apparatus, a substrate is transferred from the transfer chamber into the cleaning chamber. As the substrate enters the cleaning chamber, the aerosol is jetted onto a leading region of the substrate surface and is physically cleaned (first cleaning process). The leading region then advances under the laser beam, whereby the activation energy is provided at the leading region so that the leading region is chemically cleaned second cleaning process). The substrate is then withdrawn from the cleaning chamber into the transfer chamber, whereby the leading region again is exposed to the aerosol jet (third cleaning process). In this way the entire substrate surface is both physically and chemically cleaned in a separate manner within the same cleaning chamber.

The cleaning methods thus can effectively remove contaminants, both particles and organic material, from the surface of the substrate during the fabricating of an integrated circuit such as a memory device or an LCD.

BRIEF DESCRIPTION OF THE DRAWINGS

The above objectives and advantages of the present invention will become more apparent by describing in detail preferred embodiments thereof with reference to the attached drawings in which:

FIG. 3 is a sectional view of a second cleaning chamber of the cleaning apparatus of FIG. 1;

FIG. 4 is a perspective view of an aerosol-generating nozzle of the cleaning apparatus of FIG. 1;

DETAILED DESCRIPTION OF THE INVENTION

Figure 1:
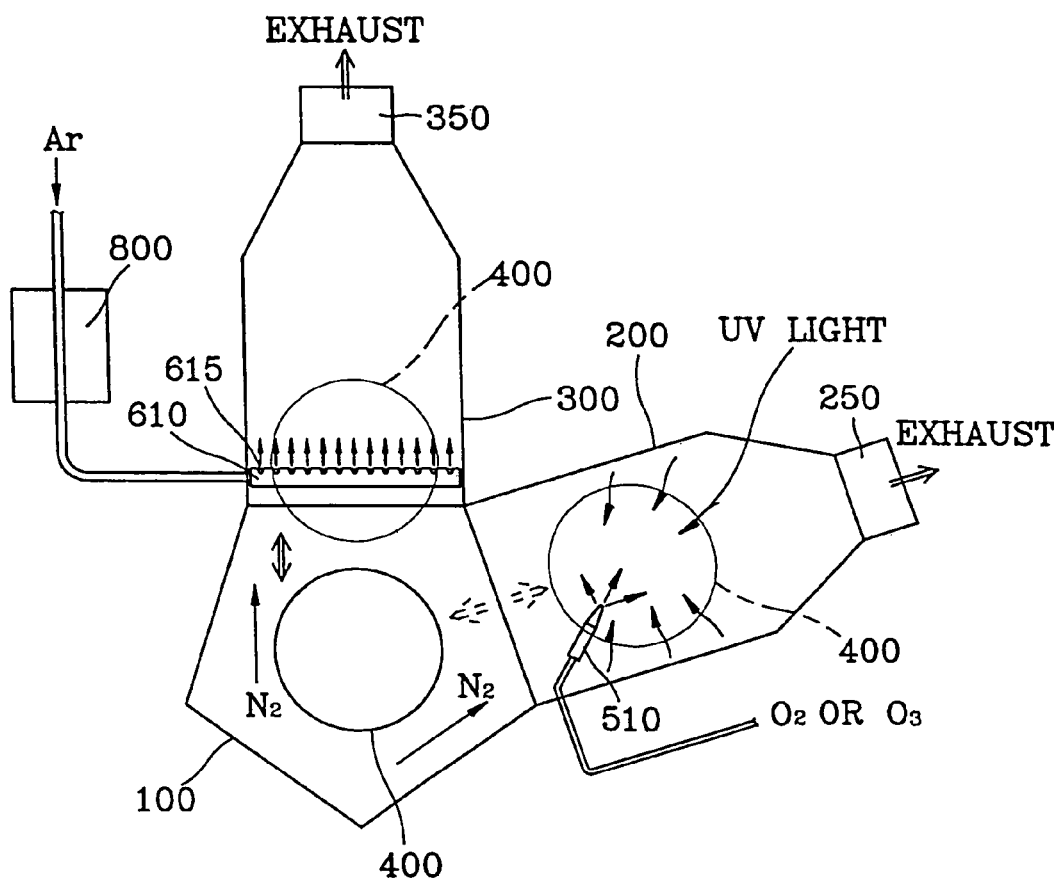
FIG. 1 is a plan view of a first embodiment of a cleaning apparatus according to the present invention.

The present invention will now be described more fully with reference to the accompanying drawings, in which the preferred embodiments of the present invention are shown. In the drawings, the shapes of elements are exaggerated for clarity. In addition, like reference numerals designate like elements throughout the drawings.

Referring to FIG. 1, the first embodiment of a cleaning apparatus according to the present invention includes one or more sets of cleaning chambers 200 and 300 connected to a central transfer chamber 100. The transfer chamber 100 sequentially transports and dispenses substrates 400 to be cleaned to the cleaning chambers 200 and 300. The substrates 400 may be supplied to or withdrawn from a loader (not shown) connected to the transfer chamber 100. A robot (not shown) may be provided in the transfer chamber 100. The substrates 400 are sequentially introduced into the transfer chamber 100. The robot sequentially transports and loads the substrates 400 into the cleaning chambers 200 and 300 and subsequently withdraws them from the cleaning chambers 200 and 300 into the transfer chamber 100.

The cleaning chambers 200 and 300 provide a place in which contaminants on the surface of the substrate 400 are removed to clean the substrate surface. Here, the term "contaminants" collectively refers to all kinds of contaminants that may accumulate on the surface of the substrate 400 as the integrated circuits are being manufactured or as the substrate 400 is being transferred, stored or is standing by during the overall manufacturing process. In the context of the present invention, the contaminants can be thought of as being largely divided into two types: particles that are removable by physical force and organic material that is removable by a chemical reaction. The surface of the substrate 400 is cleaned chiefly by a chemical reaction in the first cleaning chamber 200, whereas the surface of the substrate 400 is cleaned chiefly by physical force in the second cleaning chamber 300. In this case, the second cleaning chamber 300 is separate and discrete from the first cleaning chamber 200.

Accordingly, the cleaning of the surface of the substrate 400 using a chemical reaction is performed independently of the cleaning using physical force. Thus, the first cleaning chamber 200 may include a reactant supplier 510 and an ultraviolet light source. The second cleaning chamber 300 may include an aerosol generating nozzle 610.

More specifically, a reactant capable of forming a volatile byproduct with contaminants, in particular, organic contaminants, is directed onto the surface of the substrate 400 to chemically remove the contaminants from the surface of the substrate 400. The reactant may comprise oxygen gas or ozone. In addition, the reactant may be directed onto the surface of the substrate 400 as a fluid flow.

Thus, the reactant supplier 510 in the first cleaning chamber 200 may be a nozzle or a gas port disposed above the surface of the substrate 400. In this case, the nozzle is preferably oriented such that the orifice thereof faces the surface of the substrate 400, whereby a jet of the reactant gas issuing from the orifice impinges the surface of the substrate 400.

Furthermore, the nozzle may be located in the vicinity of the inlet of the first cleaning chamber 200 connected to the transfer chamber 100. This advantageously causes by-products of the cleaning reaction to be exhausted through an exhaust port 250 because the exhaust port 250 is disposed opposite the inlet of the first cleaning chamber 200.

If oxygen gas is used as the reactant directed onto the surface of the substrate 400, the oxygen does not readily react with contaminants on the surface of the substrate 400, in particular, with organic contaminants. Therefore, additional activation energy is required to cause the oxygen gas to react with the organic contaminants. The activation energy may be provided by light, such as ultraviolet or infrared light, directed onto the surface of the substrate 400.

Figure 2:
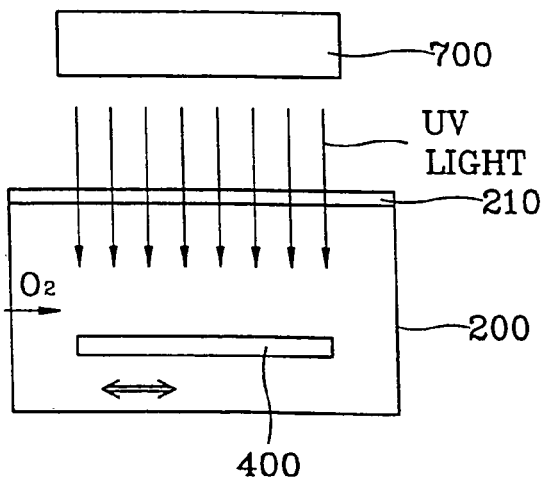
FIG. 2 is a sectional view of a first cleaning chamber of the cleaning apparatus of FIG. 1.

For example, ultraviolet light may be generated by a light source (700 in FIG. 2) such as an Hg discharge lamp disposed above the first cleaning chamber 200. The generated ultraviolet light passes through a quartz window 210, which constitutes the upper wall of the first cleaning chamber 200 or a chamber dome, and onto the substrate 400 in the first cleaning chamber 200. The ultraviolet light generated by the Hg discharge lamp may have a wavelength of 184.9 nm or 253.7 nm.

If ultraviolet light having a wavelength of 184.9 nm is directed onto the surface of the substrate 400 in the first cleaning chamber 200, the ultraviolet light actually may not be capable of decomposing organic contaminants on the surface of the substrate 400, but may be absorbed by the oxygen gas contained in the fluid flow of reactant jetted onto the surface of the substrate 400. The oxygen gas absorbs the ultraviolet light and is activated to produce oxygen radicals or is transformed into activated ozone ($O_3$). The oxygen radicals or ozone reacts with the organic contaminants to generate volatile by-products (actually decomposes the organic contaminants), and the generated by-products are exhausted through the exhaust port 250, whereby the surface of the substrate 400 is cleaned. In this way, the ultraviolet light having a wavelength of 184.9 nm chiefly aids the reaction of the reactant with the organic contaminants.

Ultraviolet light having a wavelength of 253.7 nm may be absorbed directly by organic contaminants on the surface of the substrate 400 to decompose the organic contaminants into $CO_2$ and $H_2O$.

When the chemical cleaning step performed in the first cleaning chamber 200 involves the use of ultraviolet light, it is desirable to initially have a predetermined soaking time. Because the ultraviolet or infrared radiation may heat the aluminum or stainless steel walls of the first cleaning chamber 200, a cooling system for preventing an increase in the temperature of the walls of the first cleaning chamber 200 may be installed along the outer circumference of the walls.

As described above, the surface of the substrate 400 transferred into the first cleaning chamber 200 may be chemically cleaned by a fluid flow including oxygen gas along with ultraviolet radiation.

However, even after the surface of the substrate 400 has been cleaned in this way, other types of contaminants, namely particulate material, may remain on the surface of the substrate 400. Contaminants such as particles need to be removed or cleaned by a physical mechanism.

To accomplish this, the cleaning apparatus according the present invention includes the second cleaning chamber 300 connected to the first cleaning chamber 200 via the transfer chamber 100. Hence, the substrate 400, which has been cleaned in the first cleaning chamber 200, can be successively transferred by the robot to the second cleaning chamber 300 through the transfer chamber 100. Thus, recontamination of the substrate surface is minimized. Alternatively, the substrate 400 may be cleaned in the first cleaning chamber 200 after having been cleaned in the second cleaning chamber 300. That is, after having been cleaned by physical force in the second cleaning chamber 300, the substrate 400 may be chemically cleaned in the first cleaning chamber 200.

Figures 3, 4:
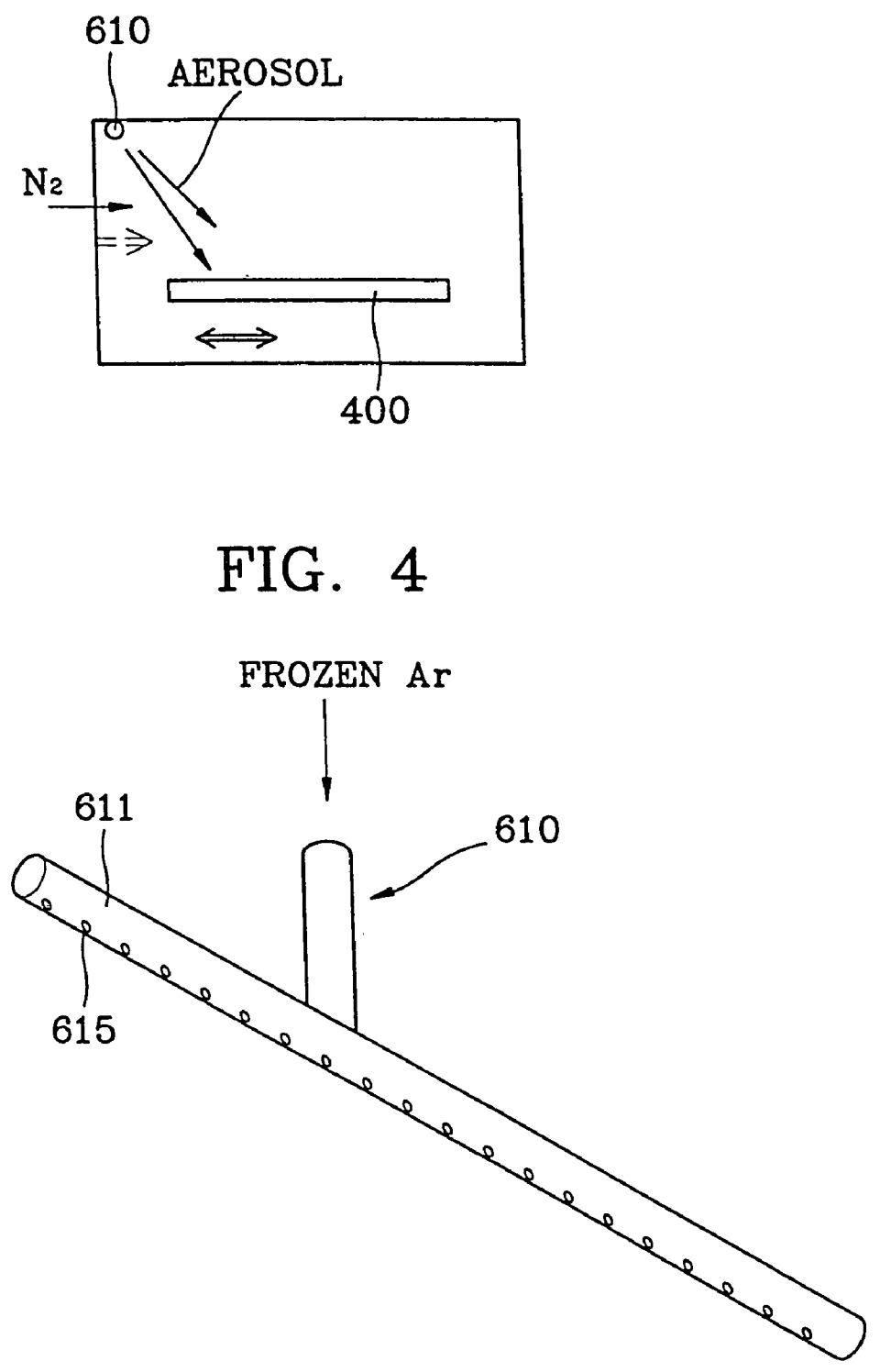

As mentioned above, substrate 400 is cleaned in the second cleaning chamber 300 using physical force. As shown in FIGS. 1 and 3, the physical force is generated by jetting an aerosol onto the surface of the substrate 400. In this case, the aerosol includes particles in the form of agglomerations of frozen gas particles. The frozen particles are projected onto the surface of the substrate 400 by the gaseous portion of the aerosol.

The frozen particles entrained in the gaseous portion of the aerosol collide with contaminant particles remaining on the surface of the substrate 400, thereby dislodging the contaminant particles from the surface of the substrate 400. Although the aerosol jet is ineffective in removing organic material, it exhibits an excellent cleaning effect on those contaminant particles that are difficult to remove using a chemical mechanism.

The frozen particles are produced by a heat exchanger 800. Preferably, an inert gas such as Ar is used for producing the aerosol. Some of the argon particles are frozen by the heat exchanger 800 and agglomerate. The frozen agglomerations of particles and the non-frozen gas particles flow into the aerosol generating nozzle 610. This mixture of frozen and gaseous particles is jetted in the form of an aerosol through orifices 615 of the nozzle 610. Preferably, the aerosol is jetted onto the surface of the substrate 400 as it is being transferred into the second cleaning chamber 300. Thus, the aerosol generating nozzle 610 is disposed above an inlet of the second cleaning chamber 300 as shown in FIGS. 1 and 3.

In this case, even if the aerosol jet would only envelop a limited region of the surface of the substrate 400, the aerosol can nonetheless be jetted over the entire surface of the substrate 400 by moving the substrate 400 from the transfer chamber 100 into the second cleaning chamber 300. To this end, the width of the aerosol jet, at the location of the substrate surface, is preferably no less than the maximum width of the substrate 400. Accordingly, as shown in FIG. 4, the aerosol generating nozzle 610 may include a plurality of nozzle orifices 615 defined in and spaced along a rod-like nozzle body 611. The length of the nozzle body 611 may be at least the diameter or maximum width of the substrate 400. The nozzle orifices 615 face the surface of the substrate 400 as the substrate passes below the aerosol generating nozzle 610, whereupon the aerosol emerging from the orifices 615 impinges the surface of the substrate 400.

The frozen argon particles of the aerosol physically impact contaminant particles on the substrate surface. The impact causes the contaminant particles to be coercively removed from the surface of the substrate 400. The substrate 400 may be passed back and forth below the aerosol generating nozzle 610 several times to ensure that the surface of the substrate 400 is sufficiently cleaned by the aerosol. Floating contaminant particles removed in this way are exhausted through an exhaust port 350 disposed at one end of the second cleaning chamber 300.

Meanwhile, before this cleaning process takes place, the second cleaning chamber 300 may be purged by nitrogen gas. The purge gas may be continuously supplied while the cleaning process is being performed. The purge gas may be supplied via a gas port (not shown) provided in the second cleaning chamber 300. Alternatively, the purge gas may be supplied via a gas port (not shown) provided in the transfer chamber 100, whereby the purge gas enters the second cleaning chamber 300 via the transfer chamber 100. The purge gas may also be supplied to the first cleaning chamber 200.

The cleaning apparatus according to the first embodiment of the present invention, as described above, comprises separate and discrete places in which the substrate surface is physically cleaned by the aerosol jet and is chemically cleaned by a fluid reactant and radiant energy provided by infrared or ultraviolet light. Accordingly, the effectiveness of the aerosol jet in cleaning the substrate surface is maximized.

Figure 5:
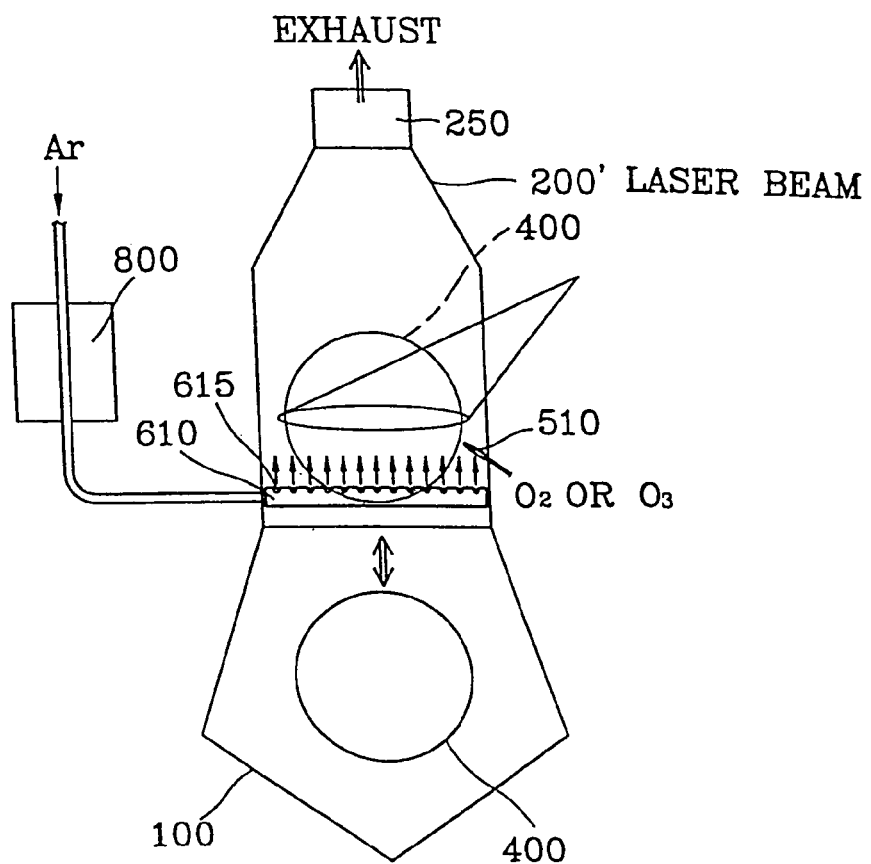
FIG. 5 is a plan view of a second embodiment of a cleaning apparatus according to the present invention.
Figure 6:
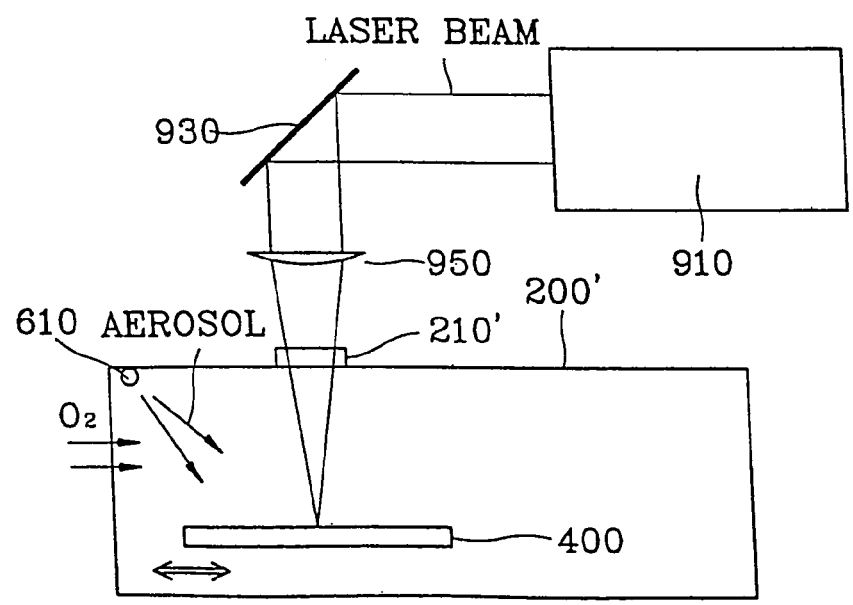
FIG. 6 is a sectional view of a first cleaning chamber of the cleaning apparatus of FIG. 5.
Figure 7:
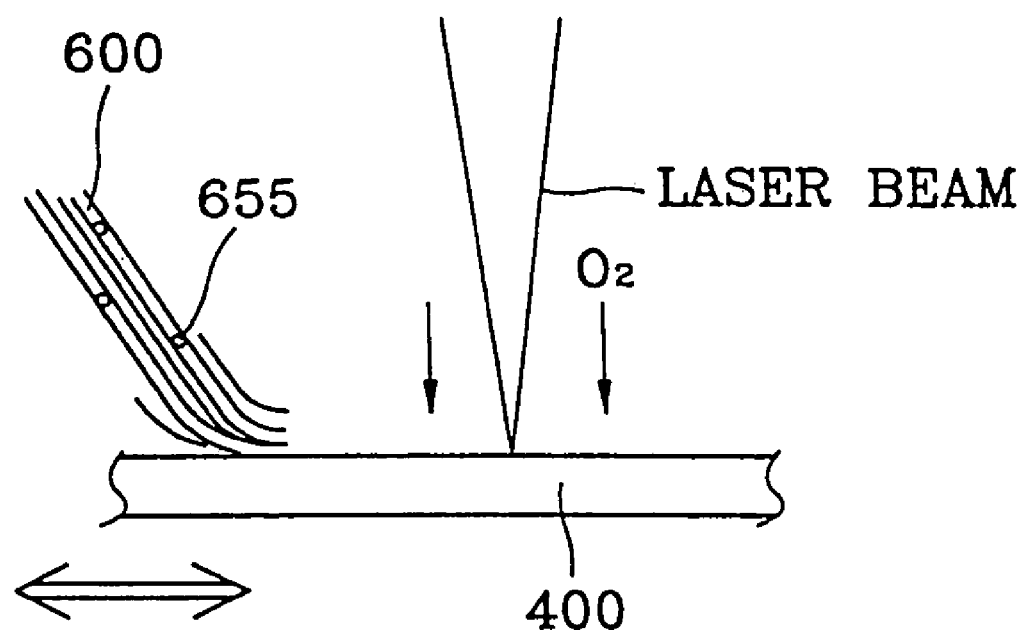
FIG. 7 is a schematic diagram of a substrate being cleaned by the cleaning apparatus of FIG. 5.

Alternatively, in a second embodiment of a cleaning apparatus according to the present invention, as shown in FIGS. 5–7, the first and second cleaning processes may be performed in the same chamber without reducing the effectiveness of the aerosol jet in cleaning the surface of the substrate. This is made possible by using a laser to provide the activation energy required to execute the chemical cleaning process.

Referring to FIGS. 5 and 6, the second embodiment of the cleaning apparatus according to the present invention includes one or more cleaning chambers 200' disposed around a transfer chamber 100. The transfer chamber 100 sequentially transfers the substrates to be cleaned to the cleaning chamber 200'. A robot (not shown) may be provided in the transfer chamber 100 to sequentially transfer and load the substrates 400, which have been sequentially supplied to the transfer chamber 100, into the cleaning chamber 200' and to collect the cleaned substrates 400 from the cleaning chamber 200'.

The cleaning chamber 200' provides a place in which contaminants on the surface of the substrate 400 are removed. As with the case of the first disclosed embodiment, the term "contaminants" collectively refers to all kinds of contaminants that may accumulate on the surface of the substrate 400 as the integrated circuits are being manufactured or as the substrate 400 is being transferred, stored or is standing by during the overall manufacturing process. However, unlike the first embodiment of the cleaning apparatus according to the present invention, the second embodiment of the cleaning apparatus is configured such that physical and chemical cleaning processes are performed in the same cleaning chamber 200'. Nevertheless, the activation energy, required for facilitating the chemical cleaning process, does not prevent the frozen particles of the aerosol from being formed or from cleaning the surface of the substrate.

More specifically, a reactant supplier 510 (e.g., a nozzle or a gas port) and a laser beam generator may be disposed in the cleaning chamber 200' to chemically remove contaminants from the surface of the substrate 400. The reactant supplier 510 produces a fluid flow comprising a reactant capable of forming volatile by-products through a chemical reaction with contaminants on the surface of the substrate 400. The reactant may include oxygen or ozone that are effective in removing organic contaminants.

The reactant supplier 510 is installed in the cleaning chamber 200' in such a way as to direct the reactant onto the surface of the substrate 400. Preferably, the reactant supplier 510 comprises a nozzle whose orifice is directed toward the surface of the substrate 400 so that a fluid jet of the reactant issuing from the nozzle impinges the surface of the substrate 400. Furthermore, the nozzle may be located in the vicinity of the inlet of the cleaning chamber 200', i.e., adjacent the location at which the cleaning chamber 200' is connected to the transfer chamber 100. This advantageously facilitates the exhausting of the by-products of the cleaning reaction through an exhaust port 250 because the exhaust port 250 is disposed opposite the inlet of the cleaning chamber 200'.

Alternatively, the fluid flow comprising the reactant oxygen gas may be provided in the transfer chamber 100. That is, a reactant supplier such as a gas port is installed in the transfer chamber 100. The fluid flow comprising the reactant is directed from the transfer chamber 100 towards the cleaning chamber 200', thereby providing the cleaning chamber 200' with the reactant.

However, reactant gas, such as oxygen may not readily directly react with contaminants on the surface of the substrate 400, in particular, organic contaminants. Thus, activation energy is required to cause the oxygen to react with the organic contaminants. The activation energy may be provided by a laser beam that irradiates the surface of the substrate 400.

The laser beam may be generated by a laser beam generator including a laser 910, a lens 950, and a reflector 930 that reflects the laser beam from laser 910 through the lens 950. The laser beam is emitted into the cleaning chamber 200' through a quartz window 210' disposed on an upper wall of the cleaning chamber 200'. The laser beam is focused by the lens 950 onto a predetermined focal plane, that coincides with the surface of the substrate 400 as the substrate is being transferred into the cleaning chamber 200'. The cross section of the laser beam at the focal plane, i.e., at the substrate surface, can be controlled by the lens 950. In this case, the laser beam has an elongate cross section at the surface of the substrate 400, as shown in FIG. 5. Therefore, although the laser beam irradiates a limited region, substantially the entire surface of the substrate 400 can be irradiated with the laser beam by moving the substrate 400 across the path of the beam. In this case, the cross section of the laser beam at the surface of the substrate 400 has a length greater than the width of the substrate 400 in one or more directions.

The energy provided by the laser activates the oxygen gas or ozone to produce oxygen radicals or activated ozone ($O_3$). Also, the laser supplies the activation energy required to react the oxygen radicals or activated ozone with organic contaminants on the substrate surface to generate volatile by-products (actually decomposes the organic contaminants), and the generated by-products are exhausted through the exhaust port 250, whereby the surface of the substrate 400 is cleaned.

As was mentioned above, the surface of the substrate 400 is also cleaned in the cleaning chamber 200', using physical force. To this end, an aerosol-generating nozzle 610 may be disposed in the cleaning chamber 200'. As in the first embodiment, the aerosol includes agglomerations of frozen gas particles, produced using a heat exchanger 800. Again, the gas is preferably argon. The aerosol of gaseous argon and frozen particles of argon issue from the orifices 615 of nozzle 610. The frozen argon particles that reach the surface of the substrate 400 collide With contaminant particles remaining on the surface of the substrate 400, thereby dislodging the contaminant particles from the surface of the substrate 400. Floating contaminant particles removed in this way are exhausted through the exhaust port 250 at one end of the cleaning chamber 200'.

The aerosol-generating nozzle 610 is disposed above an inlet of the second cleaning chamber 300, as shown in FIGS. 5 and 6, to spray the surface of the substrate 400 with the aerosol as the substrate 400 is being transferred into the cleaning chamber 200' or is being withdrawn from the cleaning chamber 200' into the transfer chamber. In this case, even if the aerosol jet has a cross-sectional area corresponding to only a limited region on the surface of the substrate 400, the aerosol can be jetted over the entire surface of the substrate 400. Preferably, the width of the cross-sectional area of the aerosol jet is no less than that of the substrate 400. To this end, the aerosol-generating nozzle 610 may be of the type previously described and shown in FIG. 4.

Meanwhile, before this cleaning process takes place, the cleaning chamber 200' may be purged by nitrogen gas. The purge gas may be continuously supplied while the cleaning process is being performed. The purge gas may be supplied via a gas port (not shown) provided in the cleaning chamber 200'. Alternatively, the purge gas may be supplied via a gas port (not shown) provided in the transfer chamber 100, whereby the purge gas enters the cleaning chamber 200' via the transfer chamber 100.

As is clear from the description above, in the second embodiment of the cleaning apparatus according to the present invention, the laser beam and the aerosol are directed at separate locations within the cleaning chamber 200' and hence, impinge discrete areas of the substrate surface at any given moment, as shown in FIGS. 5 and 6. More specifically, as shown in FIG. 7, the laser beam is emitted onto a region on the substrate surface different from that onto which the aerosol jet is directed. The frozen argon particles 655 of the aerosol jet 600 are not exposed to the laser beam before reaching the surface of the substrate 400 because laser beam is a highly directional or near-zero-divergence beam.

Thus, the frozen argon particles 655 in the aerosol 600 are prevented from evaporating into a gas due to heating by laser beam irradiation before colliding with contaminant particles on the substrate surface. Furthermore, since the aerosol generating nozzle 610 is not actually exposed to the emitting laser beam, the aerosol generating nozzle 610 is not heated by laser beam irradiation. Thus, the formation of an aerosol is not disturbed. Furthermore, since the laser beam is highly directional, the heating of the wall of the cleaning chamber 200' due to the laser beam irradiation or a temperature rise in the cleaning chamber 200' can be prevented.

Accordingly, physical cleaning by the frozen argon particles 655 contained in the aerosol 600 can be effectively performed in the cleaning chamber 200' as described above through chemical cleaning is also performed therein.

According to a cleaning method using the cleaning apparatus according to the second embodiment of the present invention, after the substrate 400 is transferred to the transfer chamber 100, the substrate 400 is transferred from the transfer chamber 100 to the cleaning chamber 200'. There, the aerosol is jetted onto the surface of the substrate 400 as the substrate 400 is moved under the aerosol-generating nozzle 610 to thereby clean the surface of the substrate 400 (first cleaning process). Subsequently, the surface of the substrate is exposed to a fluid comprising a reactant and then is irradiated with a laser beam (second cleaning process). Next, the substrate 400 is transferred from the cleaning chamber 200' to the transfer chamber 100 to wherein the aerosol is again jetted onto the surface of the substrate 400 (third cleaning process). As a result, contaminants are effectively removed from the surface of the substrate 400.

Finally, although the present invention has been particularly shown and described with references to the preferred embodiments thereof, various changes in form and details may be made thereto without departing from the spirit and scope of the invention as defined by the appended claims.

What is claimed is:

1. A method of removing contaminants from the surface of a substrate, said method comprising:
   directing a fluid comprising a reactant, capable of chemically removing contaminants from, the surface of the substrate, onto the surface of the substrate, and irradiating the surface of the substrate with light to supply activation energy that causes a chemical reaction of the reactant with contaminants on the surface of the substrate, thereby chemically cleaning the substrate; and
   jetting an aerosol comprising frozen gas particles onto the surface of the substrate to dislodge contaminants from the surface of the substrate, thereby physically cleaning the substrate,
   wherein over the entire course of said irradiating the surface of the substrate and said jetting of the aerosol onto the surface of the substrate, said irradiating and said jetting are carried out in a separate manner that prevents the frozen particles of the aerosol from being evaporated by said light, and
   wherein said chemical cleaning of the substrate and said physical cleaning of the substrate are performed in a common cleaning chamber, and said irradiating the surface of the substrate with light comprises directing a laser beam onto a region on the surface of the substrate separate from a region on the surface at which the aerosol is directed, whereby the laser beam and the aerosol impinge discrete areas of the substrate.

2. The cleaning method of claim 1, wherein the reactant comprises a gas selected from the group consisting of oxygen and ozone.

3. The cleaning method of claim 1, wherein said jetting an aerosol comprising frozen gas particles comprises freezing gaseous particles of argon, whereupon the frozen argon particles agglomerate, and jetting the frozen agglomerated particles towards the surface of the substrate.

4. The cleaning method of claim 1, wherein said jetting an aerosol comprises spraying the aerosol over a width at least as great as the maximum width of the substrate, and moving the substrate relative to the aerosol until the entire surface of the substrate has been impinged by the aerosol.

* * * * *